US009586826B2

(12) United States Patent
Choi et al.

(10) Patent No.: US 9,586,826 B2
(45) Date of Patent: Mar. 7, 2017

(54) METHOD OF GROWING HIGH-QUALITY SINGLE LAYER GRAPHENE BY USING CU/NI MULTI-LAYER METALIC CATALYST, AND GRAPHENE DEVICE USING THE SAME

(71) Applicant: Electronics and Telecommunications Research Institute, Daejeon (KR)

(72) Inventors: Jin Sik Choi, Daejeon (KR); Hong Kyw Choi, Daejeon (KR); Ki Chul Kim, Daejeon (KR); Young Jun Yu, Daejeon (KR); Jin Soo Kim, Namyangju-si (KR); Choon Gi Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 435 days.

(21) Appl. No.: 14/314,153

(22) Filed: Jun. 25, 2014

(65) Prior Publication Data
US 2015/0191358 A1  Jul. 9, 2015

(30) Foreign Application Priority Data
Jan. 9, 2014 (KR) .......................... 10-2014-0002973

(51) Int. Cl.
*C01B 31/04* (2006.01)
*H01L 21/04* (2006.01)

(52) U.S. Cl.
CPC ...... *C01B 31/0453* (2013.01); *H01L 21/0425* (2013.01); *Y10T 428/24802* (2015.01); *Y10T 428/24851* (2015.01)

(58) Field of Classification Search
None
See application file for complete search history.

(56) References Cited

U.S. PATENT DOCUMENTS 9,029,836 B2 * 5/2015 Park ...................... B82Y 30/00
257/204
2011/0108609 A1   5/2011 Woo et al.
(Continued)

FOREIGN PATENT DOCUMENTS

KR   10-2011-0051584 A   5/2011
KR   10-2012-0042655 A   5/2012
(Continued)

OTHER PUBLICATIONS

Jang-Ung Park et al., "Synthesis of monolithic graphene-graphite integrated electronics", Nature Materials, vol. 11, pp. 120-125, Feb. 2012.
(Continued)

*Primary Examiner* — Gerard Higgins
(74) *Attorney, Agent, or Firm* — Rabin & Berdo, P.C.

(57) ABSTRACT

Disclosed are a method of growing a high-quality single layer graphene by using a Cu/Ni multi-layer metallic catalyst, and a graphene device using the same. The method controls and grows a high-quality single layer graphene by using the Cu/Ni multilayer metallic catalyst, in which a thickness of a nickel lower layer is fixed and a thickness of a copper upper layer is changed in a case where a graphene is grown by a CVD method. According to the method, it is possible to obtain a high-quality single layer graphene, and improve performance of a graphene application device by utilizing the high-quality single layer graphene and thus highly contribute to industrialization of the graphene application device.

11 Claims, 3 Drawing Sheets

(56) References Cited

U.S. PATENT DOCUMENTS

2012/0267041 A1    10/2012   Woo et al.
2013/0214252 A1     8/2013   Park et al.

FOREIGN PATENT DOCUMENTS

KR    10-2012-0119789 A    10/2012
WO    WO 2012033869 A1 *   3/2012  ............. B82Y 30/00

OTHER PUBLICATIONS

Xun Liu et al., "Segregation Growth of Graphene on Cu—Ni Alloy for Precise Layer Control", The Journal of Physical Chemistry C, 115, pp. 11976-11982, 2011.

* cited by examiner

METHOD OF GROWING HIGH-QUALITY SINGLE LAYER GRAPHENE BY USING CU/NI MULTI-LAYER METALIC CATALYST, AND GRAPHENE DEVICE USING THE SAME

CROSS-REFERENCE TO RELATED APPLICATIONS

This application is based on and claims priority from Korean Patent Application No. 10-2014-0002973, filed on Jan. 9, 2014, with the Korean Intellectual Property Office, the disclosure of which is incorporated herein in its entirety by reference.

BACKGROUND

1. Field

The present invention relates to a method of growing a high-quality single layer graphene by using a Cu/Ni multi-layer metallic catalyst, and a graphene device using the same. More particularly, the present invention relates to a method of controlling and growing a high-quality single layer graphene using a Cu/Ni multi-layer metallic catalyst in which a thickness of a nickel lower layer is fixed, and a thickness of a copper upper layer is changed when growing a graphene by a CVD method, and a graphene device using the same.

2. Discussion of Related Art

Recently, research on application of a single layer graphene as a channel has been actively conducted according to necessity for a transparent and flexible device.

The graphene is divided into a single layer graphene and a multi-layer graphene according to a use purpose, and it is known that a Cu metallic catalyst, in which a grown graphene is limited to a single layer, is used in order to grow the single layer graphene, and a metallic catalyst, such as Ni or Co, having high solubility of C-atom at a high temperature is used in order to grow a multi-layer graphene.

Recently, a method of using an alloy in which a ratio of Ni and Cu is changed by applying the above method, and a result of changing the number of layers of a graphene from a single layer to a multi-layer by stacking a thin film having a Cu/Ni structure and controlling a thickness of Ni have been reported. Further, when a graphene is grown by configuring a catalyst pattern by using Ni, Co, and the like on the Ni/Cu structure, graphene combinations having the different number of layers may be disposed according to a combination of the catalyst, and applicability that a device formed of only a graphene may be manufactured by once growth by using a metallic catalyst substrate disposed in the pattern is confirmed.

However, in the reported existing method of growing the single layer graphene by using the Cu—Ni alloy having different composition or changing a thickness of Ni (lower layer) in the Cu/Ni structure, a process of manufacturing a pattern of the device in which the single layer and the multi-layer are combined is complex, and when a copper upper layer is deposited on the patterned nickel lower layer, it is difficult to confirm the pattern during the process.

Further, a result of the manufacturing of the high-quality single layer demanded in an application device, and the device employing the multi-layer graphene in the reported existing method still comes short of an expectation.

SUMMARY

In this respect, the present inventors confirms that a high-quality single layer graphene may be grown by using a Cu/Ni multi-layer catalyst, in which a thickness of a nickel lower layer is fixed, and a thickness of a copper upper layer is changed, when growing a graphene by a CVD method, and completes the present invention.

The present invention has been made in an effort to provide a method of growing a high-quality single layer graphene by using a Cu/Ni multi-layer metallic catalyst, in which a thickness of a Ni lower layer is fixed and a thickness of an upper Cu thin film is changed in a Cu/Ni structure.

Further, the present invention has been made in an effort to provide a graphene device in which a high-quality single layer graphene is used as a channel and a multi-layer graphene is formed as an electrode by utilizing the method of growing a high-quality single layer graphene.

An embodiment of the present invention provides a method of growing a single layer graphene, including: forming a silicon oxide layer on a silicon substrate; forming a multi-layer metallic catalyst layer including a nickel lower-layered thin film and a copper upper-layered thin film on the silicon oxide layer; and growing a single layer graphene on the multi-layer metallic catalyst by Chemical Vapor Deposition (CVD), in which a thickness ratio of the copper upper-layered thin film and the nickel lower-layered thin film is 6:3 to 10:3.

Another embodiment of the present invention provides a method of growing a graphene, including: a nickel lower-layered thin film on the silicon oxide; forming a copper upper-layered pattern, which covers a channel region and exposes an electrode region of the nickel lower-layered thin film, on the nickel lower-layered thin film; and growing a single layer graphene for a channel on the copper upper-layered pattern, and growing a multi-layer graphene for an electrode on the nickel lower-layered thin film exposed by the copper upper-layered pattern.

Yet another embodiment of the present invention provides a graphene device, including: a silicon substrate; a silicon oxide layer formed on the silicon substrate; a nickel lower-layered thin film formed on the silicon oxide layer; a copper upper-layered pattern formed on the nickel lower-layered thin film; a multi-layer graphene electrode grown on the nickel lower-layered thin film; and a single layer graphene channel grown on the copper upper-layered pattern.

According to the exemplary embodiments of the present invention, it is possible to obtain a high-quality single layer graphene by growing a graphene by fixing a thickness of a nickel lower layer and controlling a thickness of a copper upper layer in a Cu/Ni multilayer metallic catalyst structure. Accordingly, it is expected to improve performance of a graphene application device and highly contribute to industrialization of the graphene application device by using the high-quality single layer graphene as a channel, and it is possible to highly contribute to development of a flexible transparent electrode and transparent device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
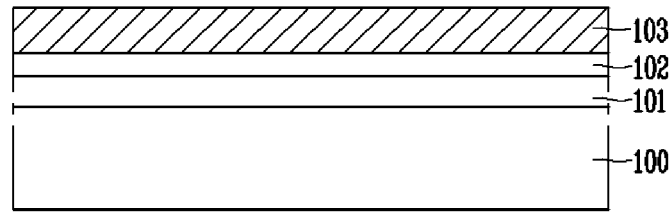
FIG. 1 is a structural diagram schematically illustrating a multi-layer metallic catalyst for growing a high-quality single layer graphene thin film according to an exemplary embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

As those skilled in the art would realize, the described embodiments may be modified in various different ways, all without departing from the spirit or scope of the present invention. In the drawings, thicknesses are enlarged to clearly express various portions and areas. Throughout the specification, similar parts are denoted by the same reference numerals.

Hereinafter, a method and a condition of growing a high-quality graphene according to an exemplary embodiment of the present invention, and an application thereof will be described in detail with reference to FIGS. 1 and 2.

FIG. 1 is a structural diagram schematically illustrating a multi-layer metallic catalyst for growing a high-quality single layer graphene thin film according to an exemplary embodiment of the present invention.

Referring to FIG. 1, a multi-layer metallic catalyst according to the present invention includes a nickel lower-layered thin film 102 and a copper upper-layered thin film 103 sequentially formed on an Si substrate 100 on which an oxide silicon ($SiO_2$) layer 101 is formed. Here, a thickness ratio of the nickel lower-layered thin film 102 and the copper upper-layered thin film 103 may be 6:3 to 10:3, and preferably be 7:3.

The silicon oxide layer 101 formed on the Si substrate 100 has a thickness of about 250 to 350 μm, and is formed by a method generally used in this field, for example, a thermal oxidation.

Next, the nickel lower-layered thin film 102 is formed on the Si substrate 100 on which the silicon oxide layer is formed, and a thickness thereof is fixed. In this case, the fixed thickness may be, for example, 300 nm. The nickel lower-layered thin film may also be formed by a method generally used in this field.

Subsequently, the copper upper-layered thin film 103 is formed on the nickel lower-layered thin film 102 with various thicknesses. In this case, that is, when the nickel lower-layer thin film 102 is fixed as 300 nm, the copper upper-layered thin film 103 may be formed with a thickness of 600 to 1000 nm, and preferably 700 nm. The reason is that when the copper upper-layered thin film is formed with a thickness of less than 600 nm, multi-layer graphene is grown when growing graphene, and when the thickness of the copper upper-layered thin film is more than 1000 nm, discontinuous single layer graphene is grown.

The copper upper-layered thin film may also be formed by a method generally used in this field.

When the graphene is grown under a condition under which the single layer graphene is grown on the copper upper-layered thin film, for example, a temperature of 800 to 1200° C. and gas atmosphere of $H_2+CH_4$, by chemical vapor deposition (CVD) in a tube form generally widely used for growing a graphene by using the Cu/Ni multilayered metallic catalyst having the aforementioned structure, the graphene, in which the number of layers is controlled, is grown.

According to the present invention, when the thickness of the nickel lower-layer is fixed to 300 nm, and the thickness of the copper upper layer is changed, that is, less than 600nm, the number of layers is increased, so that multi-layer graphene is grown, and when the thickness of the copper upper layer is changed, that is, more than 1000 nm, a discontinuous single layer graphene is grown. Accordingly, when the thickness of the nickel lower-layer is fixed to 300 nm, and the copper upper layer is grown with a thickness ranging from 600 nm to 1000 nm, a uniform and continuous single layer graphene is grown.

Figure 2:
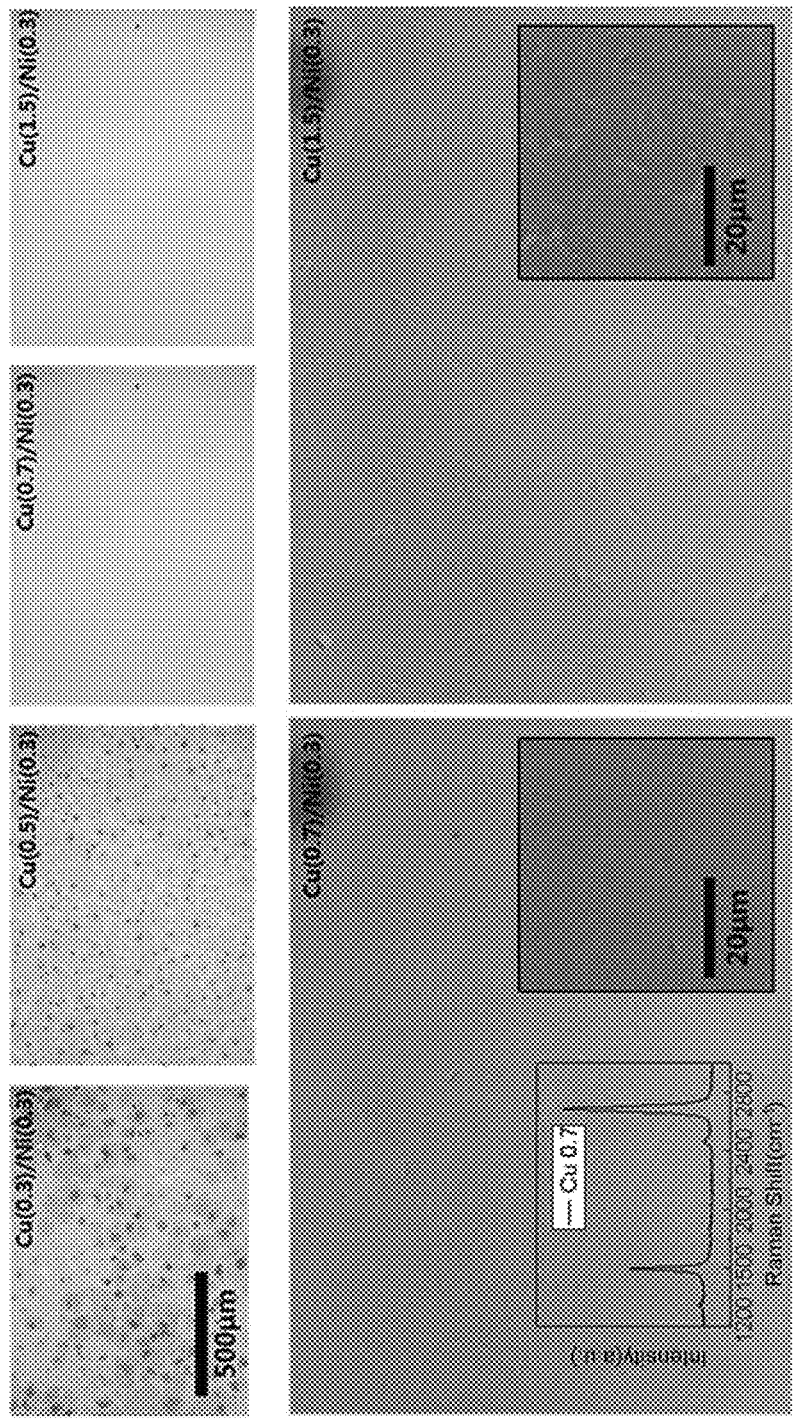
FIG. 2 is a result of a microscope and Raman analysis of a graphene grown by changing a thickness of a copper upper layer by transferring the graphene to an $SiO_2$ substrate.

FIG. 2 is a result of a microscope and Raman analysis of a graphene grown by changing a thickness of the copper upper layer by transferring the graphene to an $SiO_2$ substrate.

Referring to FIG. 2, it can be seen that as a thickness of Cu is increased, the number of layers of the grown graphene is decreased. Further, numbers within a parenthesis at a right-upper end of the drawing indicates the thickness (unit: μm), and it can be seen that when the thickness of the copper upper layer is 700 nm, the uniform and continuous single layer graphene is formed, and such a characteristic is well maintained after the graphene is transferred. However, it can be seen that when the thickness of the copper upper layer is large (1500 nm), the graphene is much broken according to the result of the transference.

Particularly, in the Cu (700 nm)/Ni (300 nm) metallic catalyst structure suggested in the present invention as the high-quality single layer graphene growing condition, according to a result of confirmation of the graphene with Raman, which is a representative analysis tool capable of confirming a structural characteristic of the grown single layer graphene, a characteristic of the single layer graphene having a small defect in which there is little D-peak, and a ratio of 2 D/G is 2 or more is exhibited. This represents that the single layer graphene grown by using the Ni/Cu multilayer metallic catalyst according to the present invention has a high quality.

Thus, according to the present invention, in order to obtain a high-quality graphene among the graphene obtainable by fixing the thickness of the nickel lower layer and changing the thickness of the copper upper layer in the Cu/Ni structure, the thickness ratio of Cu and Ni ranges from 6:3 to 10:3, and most preferably 7:3, and as the thickness of Cu is smaller than the suggested range, the number of formed layers of the graphene is increased, and when the thickness of the Cu is larger than the suggested range, the result, in which the transferred graphene is broken during the transferring process, is exhibited.

This is analyzed as a Cu—Ni alloy is formed on an interface of Cu and Ni during the high-temperature processing process (800 to 1200° C.) of growing the graphene, but the Cu layer, which does not become the alloy, is left on the upper layer, and when the ratio of Cu is decreased, the thickness of the Cu layer is also increased and crystallization is generated during the thermal processing, and as the thickness of the film is increased, crystals are increased, and thus surface tension applied to the graphene is increased.

However, according to the method of depositing Ni and Cu, a density of the metallic catalyst may be changed, so that the thickness range of the ratio of Cu:Ni suggested as the condition of growing the high-quality single layer graphene in the present invention may be changed. Further, when the thickness of the fixed lower-layered Ni is changed, the thickness ratio of Cu and Ni exhibited from the high-quality single layer graphene may be changed. In the present invention, the number of layers of the transferred graphene exhibits a tendency of "the multi-layer—the continuous single layer—the discontinuous single layer" according to a change in the thickness of Cu.

Figure 3:
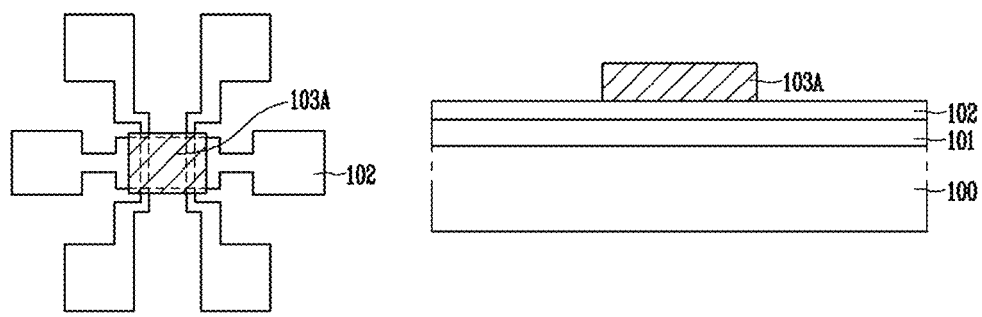
FIG. 3 is a diagram illustrating a structure of a graphene device manufactured by patterning a copper upper layer.

FIG. 3 is a top plan view and a cross-sectional view illustrating a structure of a graphene device according to an exemplary embodiment of the present invention.

As illustrated in FIG. 3, a graphene device according to the exemplary embodiment of the present invention includes a silicon substrate 100, a silicon oxide layer 101 formed on the silicon substrate 100, a nickel lower-layered thin film 102 formed on the silicon oxide layer 101, and a copper upper-layered pattern 103A formed on the nickel lower-layered thin film 102. Here, multi-layer graphene may be grown on the nickel lower-layered thin film 102, and single layer graphene may be grown on the copper upper-layered pattern 103A. Further, the multi-layer graphene grown on the nickel lower-layered thin film may be used as an electrode, and the single layer graphene grown on the copper upper-layered thin film may be used as a channel.

For example, the silicon oxide layer 101, the nickel lower-layered thin film 102, and the copper upper-layered pattern 103A are sequentially formed on the silicon substrate 100. For example, the copper upper-layered pattern 103A covering a channel region and exposing an electrode region is deposited by using a shadow mask. Next, the single layer graphene is grown on the copper upper-layered pattern 103A, and the multi-layer graphene is grown on the nickel lower-layered thin film 102 exposed by the copper upper-layered pattern 103A through a one-time growing process. Accordingly, it is possible to manufacture the graphene device including the single layer graphene channel and the multi-layer graphene electrode.

The graphene growing condition is a temperature of 800 to 1200° C. and gas atmosphere of $H_2+CH_4$ by the CVD as described above. For reference, a nickel lower-layered pattern may be formed by patterning the nickel lower-layered thin film 102, and then the copper upper-layered pattern 103A may be formed.

According to the aforementioned process, the copper upper-layered pattern is formed by designating a region in which the high-quality single layer graphene is to be grown, thereby growing the multi-layer graphene in a portion of which the topmost layer is nickel, and growing the high-quality single layer graphene in a portion of which the topmost layer is copper. Accordingly, it is possible to manufacture a high-quality single layer graphene Field Effect Transistor (FET) device by only a twice patterning processing of forming the copper upper-layered pattern 103 on the nickel lower-layered thin film 102. Further, it is possible to easily confirm an electrical property of the graphene by using the manufactured high-quality single layer graphene FET device.

Figure 4:
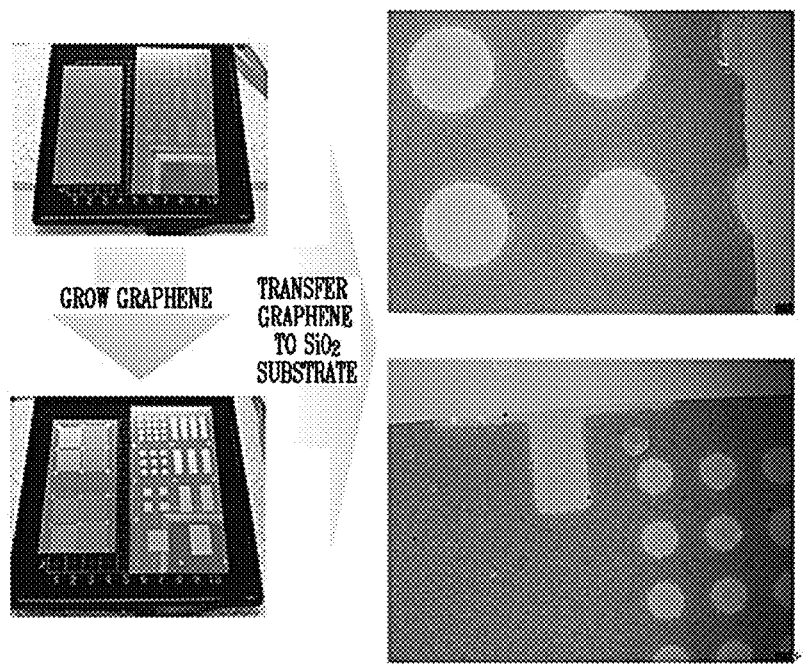
FIG. 4 is a picture illustrating a result of an experiment by disposing a multi-layer graphene and a high-quality single layer graphene.

FIG. 4 is a picture illustrating a result of an experiment by disposing the multi-layer graphene and the high-quality single layer graphene. A picture at a left-upper end is obtained by depositing a nickel lower layer with a thickness of 300 nm on the entire substrate, and depositing a copper upper-layered thin film by a thickness of 700 nm on a portion, on which a high-quality single layer graphene is to be grown, by using a shadow mask, and a picture at a left-lower end shows a result of the graphene grown by using a metallic catalyst pattern having a Cu/Ni structure. A picture at a right side is a microscope result from which it can be seen that the patterned graphene is transferred on the $SiO_2$ substrate, so that the multi-layer graphene is well connected with the single layer graphene.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of growing a single layer graphene, comprising:
   forming a silicon oxide layer on a silicon substrate;
   forming a multi-layer metallic catalyst layer including a nickel lower-layered thin film and a copper upper-layered thin film on the silicon oxide layer; and
   growing a single layer graphene on the multi-layer metallic catalyst by Chemical Vapor Deposition (CVD),
   wherein a thickness ratio of the copper upper-layered thin film and the nickel lower-layered thin film is 6:3 to 10:3.

2. The method of claim 1, wherein the thickness ratio of the copper upper-layered thin film and the nickel lower-layered thin film is 7:3.

3. The method of claim 1, wherein a condition of growing the graphene is a temperature of 800 to 1200° C. and gas atmosphere of $H_2+CH_4$.

4. The method of claim 1, wherein the nickel lower-layered thin film has a thickness of 300 nm, and the copper upper-layered thin film has a thickness of 600 nm to 1000 nm.

5. A method of growing a graphene, comprising:
   forming a silicon oxide layer on a silicon substrate;
   forming a nickel lower-layered thin film on the silicon oxide;
   forming a copper upper-layered pattern, which covers a channel region and exposes an electrode region of the nickel lower-layered thin film, on the nickel lower-layered thin film; and
   growing a single layer graphene for a channel on the copper upper-layered pattern, and growing a multi-layer graphene for an electrode on the nickel lower-layered thin film exposed by the copper upper-layered pattern.

6. The method of claim 5, wherein the forming of the copper upper-layered pattern includes depositing the copper upper-layered pattern by using a shadow mask.

7. The method of claim 6, wherein a thickness ratio of the copper upper-layered pattern and the nickel lower-layered thin film is 6:3 to 10:3.

8. The method of claim 6, wherein the nickel lower-layered thin film has a thickness of 300 nm, and the copper upper-layered thin pattern has a thickness of 600 nm to 1000 nm.

9. The method of claim 6, wherein the single layer graphene and the multi-layer graphene are grown by CVD.

10. A graphene device, comprising:
- a silicon substrate;
- a silicon oxide layer formed on the silicon substrate;
- a nickel lower-layered thin film formed on the silicon oxide layer;
- a copper upper-layered pattern formed on the nickel lower-layered thin film;
- a multi-layer graphene electrode grown on the nickel lower-layered thin film; and
- a single layer graphene channel grown on the copper upper-layered pattern.

11. The graphene device of claim 10, wherein a thickness of the nickel lower-layered thin film is 300 nm, and a thickness of the copper upper-layered pattern is 600 to 1000 nm.

* * * * *